US008298918B2

(12) United States Patent
Kang et al.

(10) Patent No.: US 8,298,918 B2
(45) Date of Patent: Oct. 30, 2012

(54) METHOD FOR FORMING SEMICONDUCTOR LAYER AND METHOD FOR MANUFACTURING LIGHT EMITTING DEVICE

(75) Inventors: Dae Sung Kang, Seoul (KR); Sang Hoon Han, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 12/948,085

(22) Filed: Nov. 17, 2010

(65) Prior Publication Data

US 2011/0195539 A1 Aug. 11, 2011

(30) Foreign Application Priority Data

Feb. 11, 2010 (KR) ........................ 10-2010-0012759

(51) Int. Cl.
*H01L 21/00* (2006.01)
*H01L 29/20* (2006.01)

(52) U.S. Cl. ......................... 438/462; 438/464; 257/615

(58) Field of Classification Search ........................ None
See application file for complete search history.

(56) References Cited

U.S. PATENT DOCUMENTS

2009/0045486 A1* 2/2009 Kohda .......................... 257/615
2009/0081821 A1 3/2009 Aihara

FOREIGN PATENT DOCUMENTS

JP 08-064791 A 3/1996
JP 2008-091608 A 4/2008
KR 10-0757802 B1 9/2007
KR 10-0782129 B1 12/2007
KR 10-2008-0037310 A1 4/2008
KR 10-2009-0047852 A 5/2009
KR 10-2009-0114870 A 11/2009

* cited by examiner

*Primary Examiner* — Fernando L Toledo
*Assistant Examiner* — Valerie N Brown
(74) *Attorney, Agent, or Firm* — Birch, Stewart, Kolasch & Birch, LLP

(57) ABSTRACT

A method for manufacturing a light emitting device according to an embodiment of the present invention includes preparing a growth substrate; selectively forming a projection pattern on the growth substrate; forming a first conductive type semiconductor layer on the growth substrate and the projection pattern; forming an active layer on the first conductive type semiconductor layer; forming a second conductive type semiconductor layer on the active layer; and executing an isolation etching for selectively removing the first conductive type semiconductor layer, the active layer, and the second conductive type semiconductor layer including the projection pattern.

12 Claims, 5 Drawing Sheets

60
50
40
30
31
21
10

METHOD FOR FORMING SEMICONDUCTOR LAYER AND METHOD FOR MANUFACTURING LIGHT EMITTING DEVICE

CROSS-REFERENCE TO RELATED APPLICATIONS

The present application claims priority of Korean Patent Application No. 10-2010-0012759 filed on Feb. 11, 2010, which is hereby incorporated by reference in its entirety.

BACKGROUND

The embodiment relates to a method for forming a semiconductor layer and a method for manufacturing a light emitting device.

A Light Emitting Diode (LED) is a semiconductor light emitting diode for converting currents into lights.

A wavelength of a light emitted from the LED depends on a semiconductor material used in manufacturing the LED. The main reason of it is that the wavelength of an emitted light is changed according to a band gap of a semiconductor material indicating an energy difference between electrons of a valence band and electrons of a conduction band.

Recently, as brightness of the LED is increasing bit by bit, the LED is widely used as a light source for display, a light source for vehicles, and a light source for illumination and it is also possible to realize an light emitting device emitting a white light of superior efficiency by use of a fluorescent material or combination of LEDs emitting various kinds of colors.

SUMMARY

The present embodiment provides a method for forming a semiconductor layer and a method for manufacturing a light emitting device to which a new method is applied.

The present embodiment provides a method for manufacturing a light emitting device wherein internal quantum efficiency of an active layer is improved remarkably.

A method for forming a semiconductor layer according to the present embodiment includes preparing a growth substrate; selectively forming a projection pattern on the growth substrate; forming a semiconductor layer on the growth substrate and the projection pattern; and selectively removing the semiconductor layer including the projection pattern.

A method for manufacturing a light emitting device according to an embodiment of the present invention includes preparing a growth substrate; selectively forming a projection pattern on the growth substrate; forming a first conductive type semiconductor layer on the growth substrate and the projection pattern; forming an active layer on the first conductive type semiconductor layer; forming a second conductive type semiconductor layer on the active layer; and executing an isolation etching for selectively removing the first conductive type semiconductor layer, the active layer, and the second conductive type semiconductor layer including the projection pattern.

DETAILED DESCRIPTION OF THE EMBODIMENTS

Figure 1:
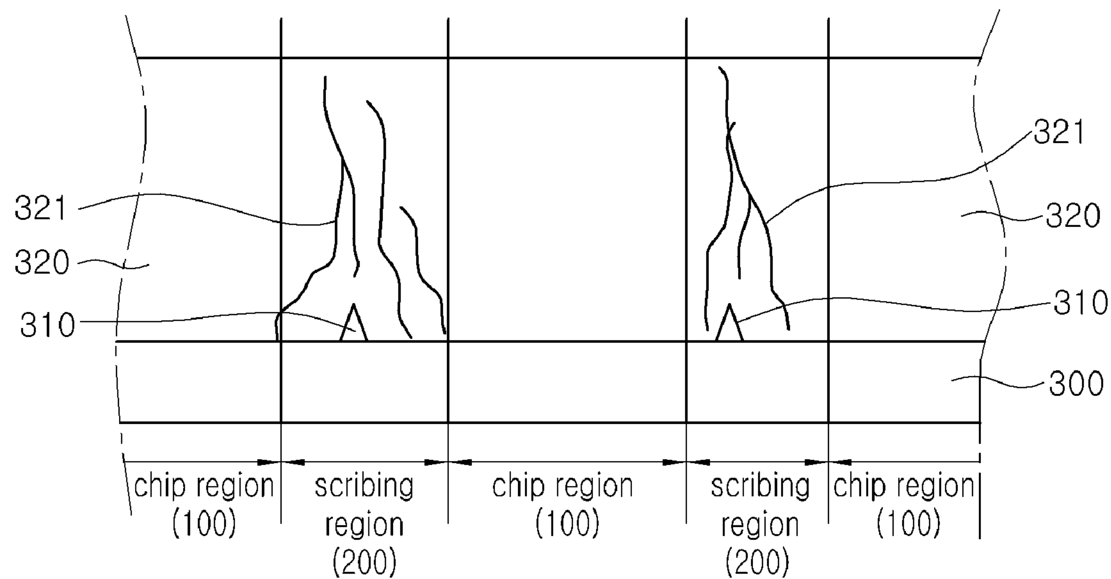
FIG. 1 and FIG. 2 are diagrams illustrating a method for forming a semiconductor layer according to the present embodiment.

In explaining the embodiment, when describing the facts that each layer (film), a region, a pattern or a structural component is formed on “a upper side/top (on)” or “a lower side/bottom (under)” of a substrate, each layer (film), a pad or patterns, the expression such as “a upper side/top (on)” or “a lower side/bottom (under)” includes the meanings of “directly forming” or “forming via other layers (indirectly)”. Further, in connection with a upper side/top or a lower side/bottom of each layer, the standards thereof will be explained based on the drawings.

In the drawings, thickness or size of each layer is exaggerated, omitted or illustrated schematically for convenience and clarity of explanation. Further, size of each constituent is not illustrated by totally reflecting a real size.

Below, a method for forming a semiconductor layer and a method for manufacturing a light emitting device according to the present embodiment will be explained in detail while referring to the attached drawings.

Figure 2:
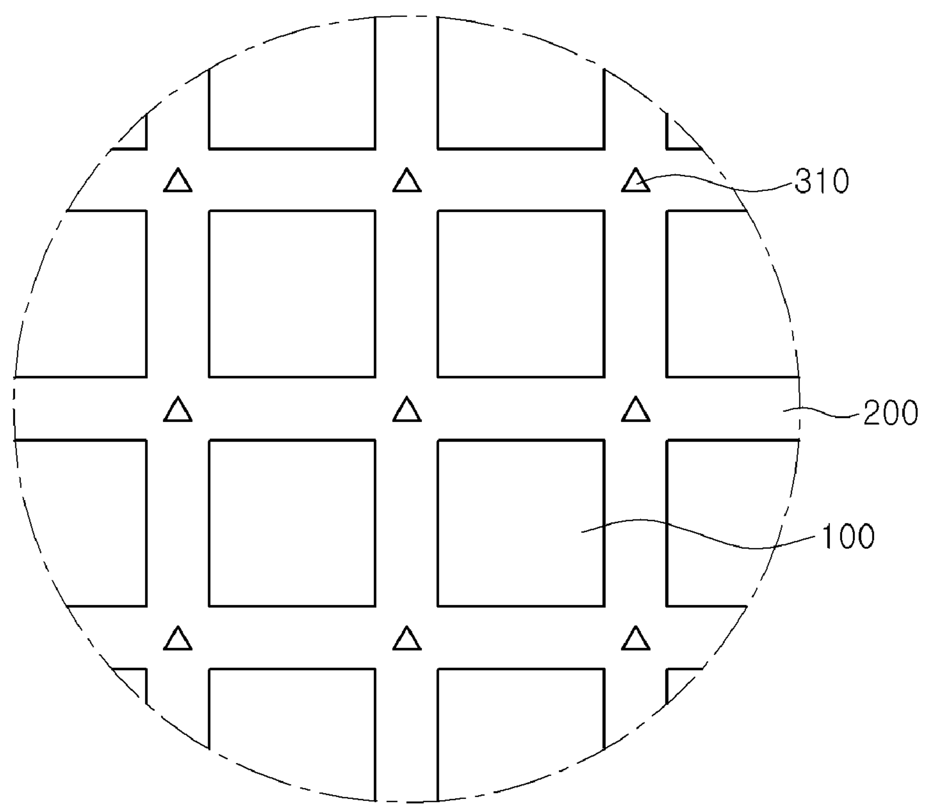

FIG. 1 and FIG. 2 are diagrams illustrating a method for forming a semiconductor layer according to the present embodiment.

Referring to FIG. 1 and FIG. 2, first of all, a projection pattern 310 is selectively formed on the growth substrate 300 and then, a semiconductor layer 320 is formed on the growth substrate 300 including the projection pattern 310.

For example, at least any one selected from a sapphire ($Al_2O_3$), SiC, Si, GaAs, GaN, ZnO, Si, GaP, $LiAl_2O_3$, InP, BN, $Ga_2O_3$, AlN or Ge may be used for forming the growth substrate 300. In addition, FIG. 1 illustrates a substrate where the upper side of the growth substrate 300 is formed flatly, but PSS (Patterned Sapphire Substrate) where a pattern is formed on the upper side thereof may be employed.

The projection pattern 310 is locally formed on the growth substrate 300. The growth substrate 300 is defined as a chip region 100 and a scribing region 200, and a semiconductor layer 320 on the chip region 100 is divided into a chip unit so that it can be used as a chip. The scribing region 200 is a region which is removed by isolation etching for dividing the chip region 100.

After forming a material layer on the growth substrate 300 for forming the projection pattern 310, the projection pattern 310 can be formed by selectively removing the material layer according to a mask pattern manufactured by a photolithography process. Further, the projection pattern 310 can be formed by selectively growing the material layer according to mask pattern manufactured on the growth substrate 300 by a photolithography process.

For example, the projection pattern 310 may be formed by an aluminum oxidation layer and the semiconductor layer 320 may be GaN-based semiconductor layer.

If growth of the semiconductor layer 320 is accelerated on the growth substrate 300 where the projection pattern 310 is formed, a mismatch of a growth direction is generated between the semiconductor layer 320 grown on the projection pattern 310 and the semiconductor layer 320 grown on the growth substrate 300. Therefore, a defect such as a dislocation 321 is generated.

Further, the dislocation 321 existing in the semiconductor layer 320 grown on the growth substrate 300 arranged in the vicinity of the projection pattern 310 converges to a portion where the dislocation 321 on the upper side of the projection pattern 310 exists. Therefore, the dislocation 321 exists collectively on a portion where the projection pattern 310 is arranged.

As illustrated in FIG. 2, the semiconductor layer 320 of the present embodiment can be classified into the chip region 100 used as a semiconductor chip, and the scribing region 200 for dividing the chip region 100. The projection pattern 310 is formed on the growth substrate 300 of the scribing region 200.

The scribing region 200 is a region to be removed during a process for dividing the semiconductor layer 320 into a chip unit. Thus, even if the dislocation 321 is generated collectively, quality of the semiconductor layer 320 is not influenced at all.

The projection pattern 310 can be formed on the scribing region 200 extending into a first direction or on the scribing region 200 extending into a second direction perpendicular to the first direction. Further, the projection pattern 310 can be formed on the scribing region 200 where the scribing region 200 extending into the first direction and the scribing region 200 extending into the second direction perpendicular to the first direction intersect each other.

Therefore, since the projection pattern 310 can be formed on the scribing region 200, the dislocation 321 generated on the semiconductor layer 320 is mainly distributed on the scribing region 200 and the dislocation 321 is decreased on the chip region 100. As a result, the semiconductor layer 320 of the chip region 100 can be grown as a semiconductor layer of high quality having very few defects.

That is, the projection pattern 310 is arranged on the scribing region 200 in the present embodiment, and thereby the dislocation 321 generated on the semiconductor layer 320 can be collectively distributed on the semiconductor layer 320 of the scribing region 200 so that the dislocation 321 may be decreased on the semiconductor layer 320 of the chip region 100.

Further, the projection pattern 310 and the semiconductor layer 320 arranged on the scribing region 200 can be selectively removed.

FIG. 3-FIG. 10 are the diagrams illustrating a method for manufacturing a light emitting device according to an embodiment of the present invention.

Figure 3:
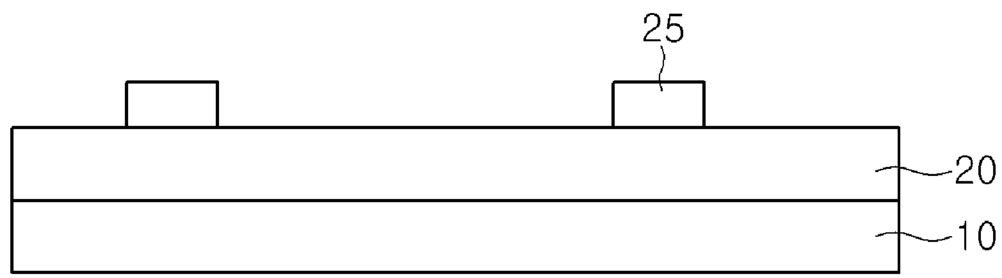
FIG. 3-FIG. 10 are diagrams illustrating a method for manufacturing a light emitting device according to an embodiment of the present invention.

Referring to FIG. 3, a material layer 20 for a projection pattern for forming a projection pattern on the growth substrate 10 is formed and a mask patter 25 is formed on the material layer 20 for a projection pattern. For example, at least any one selected from a sapphire ($Al_2O_3$), SiC, Si, GaAs, GaN, ZnO, Si, GaP, $LiAl_2O_3$, InP, BN, $Ga_2O_3$, AlN or Ge may be used for forming the growth substrate 10. In addition, an aluminum oxidation layer may be employed for forming the material layer 20 for a projection pattern.

Figure 4:
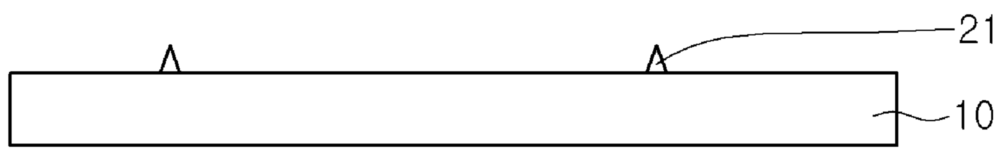

Referring to FIG. 4, the material layer 20 for a projection pattern is etched by using the mask pattern 25 as a mask and thereby, the projection pattern 21 is selectively formed on the growth substrate 10. The mask pattern 25 is formed such that the projection pattern 21 can be arranged on a scribing region. For example, the material layer 20 for a projection pattern can be etched by a dry etching or a wet etching, and when using a wet etching process, the material layer 20 for a projection pattern can be etched by using a strongly alkaline solution. Further, for example, the projection pattern 21 can be formed as a triangle pyramid or a square pyramid and it is not limited to them.

Figure 5:
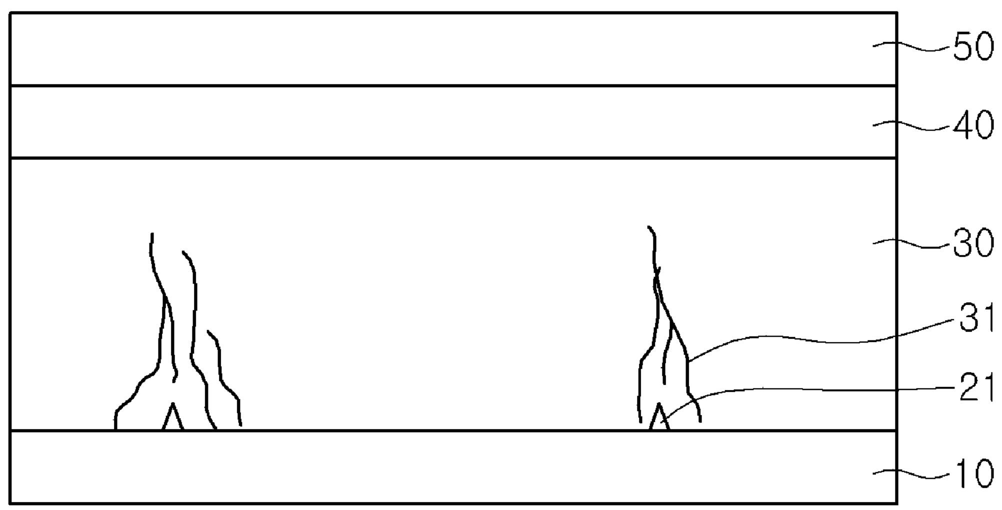

Referring to FIG. 5, a light emitting structure layer including a first conductive type semiconductor layer 30, an active layer 40, and a second conductive type semiconductor layer is formed on the growth substrate 10 where the projection pattern 21 is formed. For example, the first conductive type semiconductor layer 30 may include an n-type semiconductor layer. Any one of the semiconductor materials having a composition formula, $In_xAl_yGa_{1-x-y}N$ ($0\leqq x\leqq 1$, $0\leqq y\leqq 1$, $0\leqq x+y\leqq 1$), for example, InAlGaN, GaN, AlGaN, AlInN, InGaN, AlN, InN and the like can be selected for forming the first conductive type semiconductor layer 30, and dopants of n-type such as Si, Ge, Sn and the like can be doped into the materials. For example, the first conductive type semiconductor layer 30 can be grown by injecting trimethyl gallium gas (TMGa), $SiN_4$, hydrogen gas, and ammonia gas into a chamber.

The first conductive type semiconductor layer 30 is grown on the growth substrate 10 and the projection pattern 21. And, the first conductive type semiconductor layer 30 grown on the projection pattern 21 and the first conductive type semiconductor layer 30 grown on the growth substrate 10 have many dislocations 31 on the upper side of a portion where the projection pattern 21 is arranged due to a mismatch of a growth direction. Further, as the first conductive type semiconductor layer 30 is grown continuously, the dislocations 31 generated in the first conductive type semiconductor layer 30 arranged in the vicinity of the projection pattern 21 is propagated to the upper portion of the projection pattern 21 where many dislocations 31 exist.

As a result, the first conductive type semiconductor layer 30 have many dislocations 31 in a portion where the projection pattern 21 is arranged, and the first conductive type semiconductor layer 30 in a portion which is not adjacent to the projection pattern 21 can be grown as a semiconductor layer of high quality.

Though not illustrated, an undoped nitride layer can be formed on the growth substrate 10 before forming the first conductive type semiconductor layer 30. Impurities of the first conduction type are not injected into the undoped nitride layer, but the undoped nitride layer is a nitride layer which may have conduction properties of the first conduction type. For example, the undoped nitride layer can be formed as an undoped-GaN layer. Further, a buffer layer may be formed between the undoped nitride layer and the growth layer 10. Further, it is not always necessary to form the undoped nitride layer and the undoped nitride layer may not be formed.

On the other hand, the active layer 40 is formed on the first conductive type semiconductor layer 30, and the second conductive type semiconductor layer 50 is formed on the active layer 40.

The active layer 40 is a layer where electrons (or holes) injected via the first conductive type semiconductor layer 30, and holes (or electrons) injected via the second conductive type semiconductor layer 50 collide each other, and lights are emitted due to a band gap of an energy band which is changed based on a forming material of the active layer 40.

The active layer 40 can be formed as any one of a single Quantum Well, a Multi Quantum Well (MQW), a Quantum Dot, or a Quantum Line and it is not limited to these structures.

The active layer 40 can be formed by a semiconductor material having a composition formula, $In_xAl_yGa_{1-x-y}N$ ($0\leqq x\leqq 1$, $0\leqq y\leqq 1$, $0\leqq x+y\leqq 1$). When the active layer 40 is formed as the Multi Quantum Well, the active layer 40 can be formed by stacking a plurality of well layers and a plurality of barrier layers. For example, it can be formed by stacking an InGaN well layer/a GaN barrier layer periodically.

A clad layer (not shown) into which dopants of n-type or dopants of p-type are doped can be formed on the upper side and/or the lower side of the active layer 40, the clad layer (not shown) can be realized by an AlGaN layer or an InAlGaN layer.

Further, an InGaN/GaN super-lattice structure or an InGaN/InGaN super-lattice structure of the first conduction type can be formed between the first conductive type semiconductor layer 30 and the active layer 40. Further, an AlGaN layer of the second conduction type can be formed between the second conductive type semiconductor layer 50 and the active layer 40.

The second conductive type semiconductor layer 50 can be formed by for example, a semiconductor layer of p-type. Any one of the semiconductor materials having a composition formula, that is, $In_xAl_yGa_{1-x-y}N$ ($0 \leqq x \leqq 1$, $0 \leqq y \leqq 1$, $0 \leqq x+y \leqq 1$), for example, InAlGaN, GaN, AlGaN, InGaN, AlInN, AlN, InN and the like can be selected for forming the second conductive type semiconductor layer 50. Dopants of p-type such as Mg, Zn, Ca, Sr, Ba and etc. may be doped.

For example, the second conductive type semiconductor layer 50 can be grown by injecting trimethyl gallium gas (TMGa), $EtCp_2Mg$) $\{Mg\ (C_2H_5C_5H_4)_2\}$, hydrogen gas, and ammonia gas into a chamber.

Meanwhile, the first conductive type semiconductor layer 30 may include a semiconductor layer of p type, and the second conductive type semiconductor layer 50 may include a semiconductor layer of n-type. Further, a third conductive type semiconductor layer (not shown) including semiconductors of n-type or p-type may be formed on the second conductive type semiconductor layer 50. Therefore, the light emitting structure layer can have at least any one of np, pn, npn, pnp junctions. Further, doping concentrations of impurities can be formed uniformly or non-uniformly in the first conductive type semiconductor layer 30 and the second conductive type semiconductor layer 50. That is, the light emitting structure layer can be formed as diverse type s and it is not limited to them.

Figure 6:
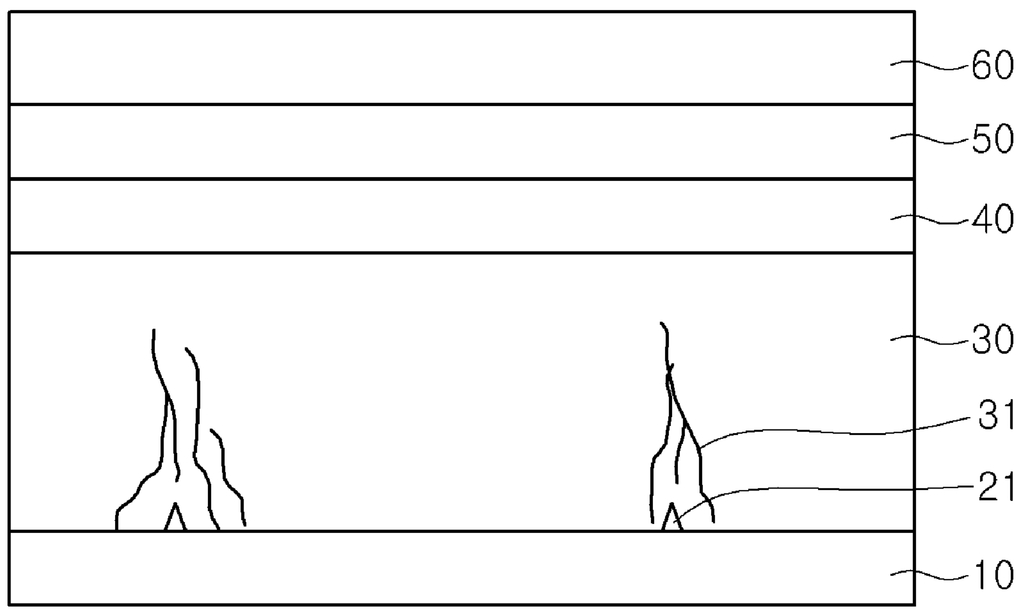

Referring FIG. 6, a conductive support substrate 60 is formed on the second conductive type semiconductor layer 50. The conductive support substrate 60 may include a support layer, an ohmic contact layer and a bonding layer between the support layer and the ohmic contact layer. The support layer may include at least any one of Cu, Ni, Mo, Al, Au, Nb, W, Ti, Cr, Ta, Pd, Pt, Si, Ge, GaAs, ZnO, SiC. Further, since the ohmic contact layer is formed by a metal including Ag or Al, it can perform an ohmic contact with the second conductive type semiconductor layer 50 and also can function as a reflection layer. Alternatively, in connection with the ohmic contact layer, a layer for the ohmic contact and a reflection layer may be prepared additionally. For example, the layer for the ohmic contact is formed by a material allowing the ohmic contact with the second conductive type semiconductor layer 50. For example, it may be realized as a single layer or a multi-layer by using any one or more than two components selected from ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), $IrO_x$, $RuO_x$, $RuO_x$/ITO, Ni, Ag, Ni/$IrO_x$/Au, or Ni/$IrO_x$/Au/ITO.

The bonding layer may be formed as a layer including any one or more than two components selected from Cu, Ni, Ag, Mo, Al, Au, Nb, W, Ti, Cr, Ta, Al, Pd, Pt, Si, Al—Si, Ag—Cd, Au—Sb, Al—Zn, Al—Mg, Al—Ge, Pd—Pb, Ag—Sb, Au—In, Al—Cu—Si, Ag—Cd—Cu, Cu—Sb, Cd—Cu, Al—Si—Cu, Ag—Cu, Ag—Zn, Ag—Cu—Zn, Ag—Cd—Cu—Zn, Au—Si, Au—Ge, Au—Ni, Au—Cu, Au—Ag—Cu, Cu—$Cu_2O$, Cu—Zn, Cu—P, Ni—P, Ni—Mn—Pd, Ni—P, Pd—Ni.

For example, a metal substrate or a semiconductor substrate may be used as the support layer, and the support layer may be formed by plating or bonding including at least any one selected from copper (Cu) titan (Ti), chrome (Cr), nickel (Ni), aluminum (Al), platinum (Pt), gold (Au), tungsten (W), germanium (Ge), silicon (Si), molybdenum (Mo).

Figure 7:
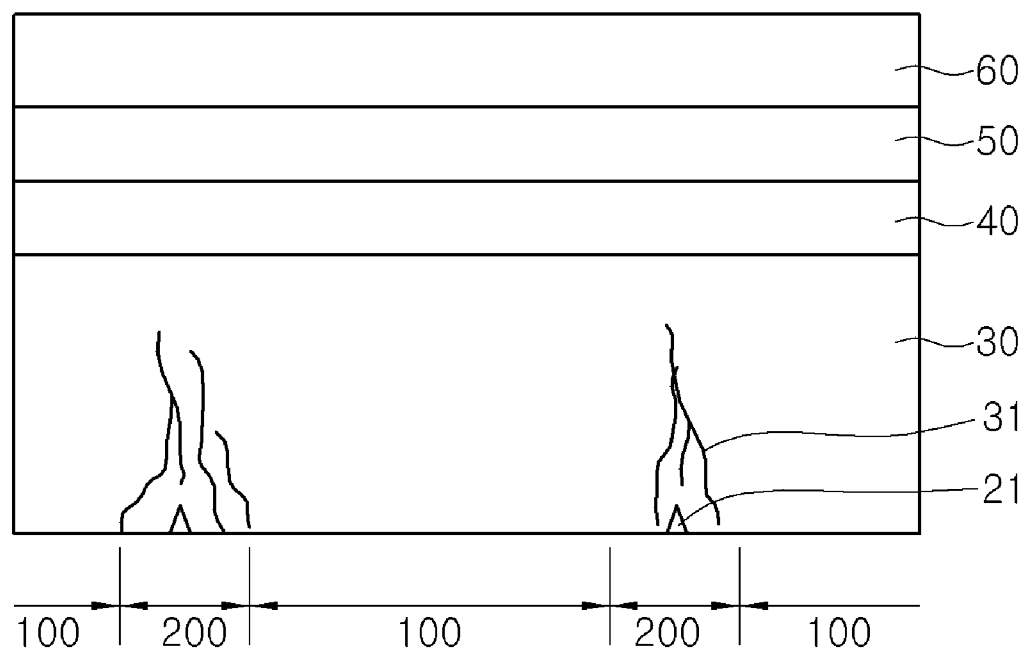

Referring FIG. 7, the growth substrate 10 is removed. The growth substrate 10 can also be removed by a Laser Lift Off method.

Figure 8:
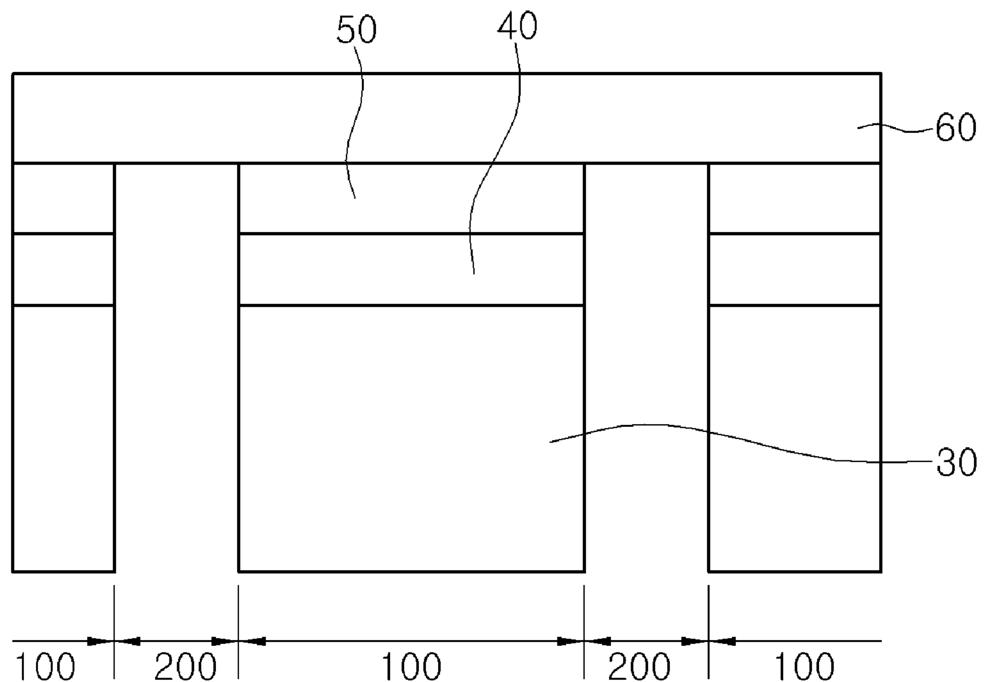

Referring FIG. 8, an isolation etching is applied to the first conductive type semiconductor layer 30, the active layer 40 and the second conductive type semiconductor layer 50, so that the scribing region 200 between the chip region 100 and the chip region 100 can be removed.

At this time, the projection pattern 21 existing in the scribing region 200 is removed and the dislocation 31 of the scribing region 200 is also removed.

Figure 9:
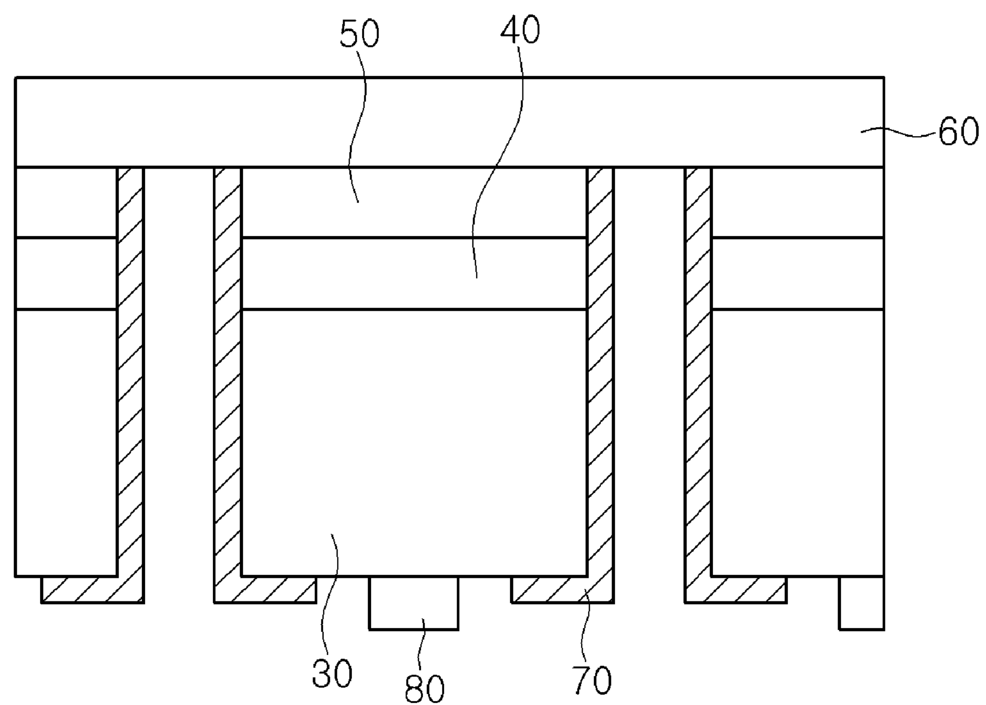

Referring to FIG. 9, a passivation layer 70 is formed on the first conductive type semiconductor layer 30, the active layer 40 and the second conductive type semiconductor layer 50, and an electrode layer 80 is formed on the first conductive type semiconductor layer 30.

Figure 10:
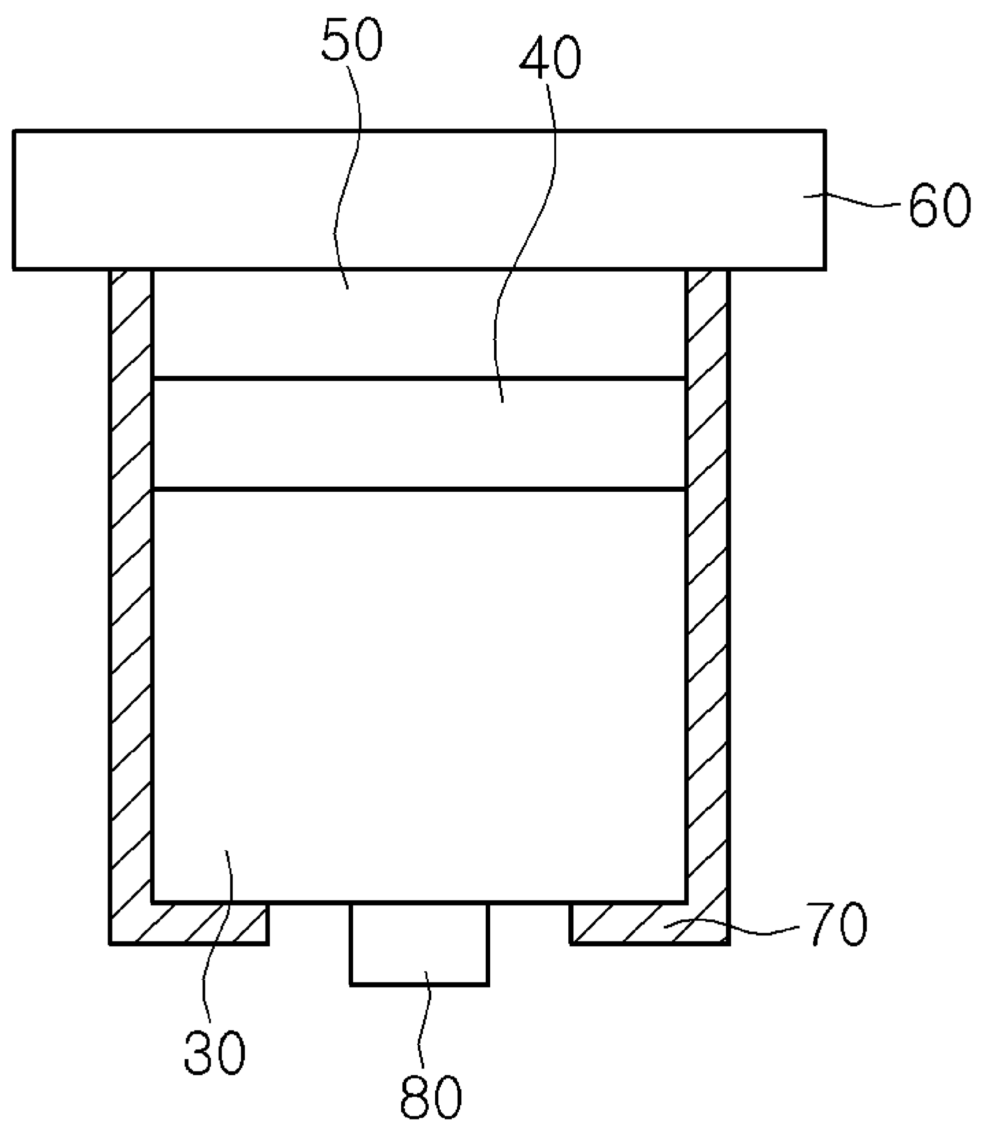

Referring to FIG. 10, if the conductive support substrate 60 is divided into a chip unit, a vertical light emitting device in which the electrode layer 80 and the conductive support substrate 60 are arranged in opposing directions can be manufactured under the condition that the first conductive type semiconductor layer 30, the active layer 40 and the second conductive type semiconductor layer 50 are arranged between the electrode layer 80 and the conductive support substrate 60.

Though not illustrated, it is also possible to manufacture the first electrode layer and the second electrode layer which are arranged in the same direction on the first conductive type semiconductor layer 30 and the second conductive type semiconductor layer 50 by using the laminated structure of FIG. 5.

For example, in the laminated structure illustrated in FIG. 5, an isolation etching for dividing the first conductive type semiconductor layer 30, the active layer 40 and the second conductive type semiconductor layer 50 into a chip unit is applied to a scribing region and a mesa etching is executed in order to expose some portions of the first conductive type semiconductor layer 30. As a result, the first electrode layer and the second electrode layer can be formed on the first conductive type semiconductor layer 30, and the second conductive type semiconductor layer 50.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for forming a semiconductor layer comprising, preparing a growth substrate;

selectively forming a projection pattern on the growth substrate;

forming a semiconductor layer on the growth substrate and the projection pattern; and selectively removing the semiconductor layer including the projection pattern, wherein the projection pattern is formed to have a peak on an upper portion thereof to generate a dislocation in the semiconductor layer.

2. The method for forming a semiconductor layer according to the claim 1, wherein the growth substrate is defined as a chip region and a scribing region, and the projection pattern is arranged on the scribing region.

3. The method for forming a semiconductor layer according to the claim 2, wherein the projection pattern is arranged on an intersection region where the scribing region extending into a first direction and the scribing region extending into a second direction perpendicular to the first direction cross each other.

4. The method for forming a semiconductor layer according to the claim 1, wherein the semiconductor layer is formed to substantially cover the projection pattern.

5. The method for forming a semiconductor layer according to the claim 1, wherein the first conductive type semiconductor layer is formed to substantially cover the projection pattern.

6. A method for manufacturing a light emitting device comprising, preparing a growth substrate;

selectively forming a projection pattern on the growth substrate;

forming a first conductive type semiconductor layer on the growth substrate and the projection pattern;

forming an active layer on the first conductive type semiconductor layer;

forming a second conductive type semiconductor layer on the active layer; and executing an isolation etching for selectively removing the first conductive type semiconductor layer, the active layer, and the second conductive type semiconductor layer including the projection pattern; and forming a peak on an upper portion of the projection pattern to generate a dislocation in the semiconductor layer.

7. The method for manufacturing a light emitting device according to the claim 6, further comprising:

forming a conductive support substrate on the second conductive type semiconductor layer, and then removing the growth substrate before executing the isolation etching.

8. The method for manufacturing a light emitting device according to the claim 7, further comprising:

forming a passivation layer on the first conductive type semiconductor layer, the active layer, and the second conductive type semiconductor layer, and forming an electrode layer on the first conductive type semiconductor layer after executing the isolation etching.

9. The method for manufacturing a light emitting device according to the claim 6, wherein the growth substrate is defined as a chip region and a scribing region, and the projection pattern is arranged on the scribing region.

10. The method for manufacturing a light emitting device according to the claim 9, wherein the projection pattern is arranged on an intersection region where a scribing region extending into a first direction and a scribing extending into a second direction perpendicular to the first direction cross each other.

11. The method for manufacturing a light emitting device according to the claim 6, wherein the first conductive type semiconductor layer, the active layer, and the second conductive type semiconductor layer include a GaN-based semiconductor layer, respectively.

12. The method for manufacturing a light emitting device according to the claim 6, wherein the projection pattern includes an aluminum oxidation layer.

* * * * *